(12) United States Patent  (10) Patent No.: US 8,604,361 B2
Sun et al.  (45) Date of Patent: Dec. 10, 2013

(54) COMPONENT PACKAGE FOR MAINTAINING SAFE OPERATING TEMPERATURE OF COMPONENTS

(75) Inventors: Mei Sun, Los Altos, CA (US); Pascal Champagne, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 710 days.

(21) Appl. No.: 12/690,882

(22) Filed: Jan. 20, 2010

(65) Prior Publication Data

US 2010/0155098 A1  Jun. 24, 2010

Related U.S. Application Data

(63) Continuation-in-part of application No. 11/302,763, filed on Dec. 13, 2005, now Pat. No. 7,757,574.

(60) Provisional application No. 61/274,116, filed on Dec. 18, 2009.

(51) Int. Cl.
*H01L 23/02* (2006.01)
*H05K 5/06* (2006.01)

(52) U.S. Cl.
USPC ............................................ 174/564; 257/687

(58) Field of Classification Search
USPC .................... 257/687; 174/559, 564; 361/737
See application file for complete search history.

(56) References Cited

U.S. PATENT DOCUMENTS

| | | |
|---|---|---|
| 3,589,979 A | 6/1971 | Finch et al. |
| 4,443,523 A | 4/1984 | Hasennauer |
| RE32,369 E | 3/1987 | Stockton et al. |
| 4,656,454 A | 4/1987 | Rosenberger |
| 4,680,569 A | 7/1987 | Yamaki et al. |
| 4,795,975 A | 1/1989 | Cox |
| 5,001,934 A | 3/1991 | Tuckey |
| 5,016,086 A * | 5/1991 | Inoue et al. .................... 257/690 |
| 5,184,107 A | 2/1993 | Maurer |
| 5,187,642 A * | 2/1993 | Garner et al. ................. 361/719 |
| 5,262,944 A | 11/1993 | Weisner et al. |
| 5,285,559 A * | 2/1994 | Thompson et al. ............. 29/841 |
| 5,341,684 A | 8/1994 | Adams et al. |

(Continued)

FOREIGN PATENT DOCUMENTS

| | | |
|---|---|---|
| EP | 0539804 | 5/1993 |
| EP | 0563713 | 10/1993 |

(Continued)

OTHER PUBLICATIONS

International Search Report for International Patent Application No. PCT/US2010/059670 dated Aug. 2, 2011.
Office Action dated Jan. 25, 2010 issued for Korean Patent Application No. 2004-7011508.
Office Action dated Oct. 20, 2009 issued for Japanese Patent Application No. 2003-563004.

(Continued)

*Primary Examiner* — Hung Ngo
(74) *Attorney, Agent, or Firm* — Joshua D. Isenberg; JDI Patent

(57) ABSTRACT

A thermally insulated electronic component package and an instrument suitable for process conditions in a high temperature environment are disclosed. The component package includes a thin electronic component, a thermally insulating outer enclosure, and an insert made of a thermally insulating material that is sized and shaped to fit within the outer enclosure. The insert includes an inner cavity sized and shaped to receive the thin electronic component. In the instrument, the outer enclosure can be configured to mount to a substrate.

28 Claims, 3 Drawing Sheets

(56) References Cited

U.S. PATENT DOCUMENTS

| | | | |
|---|---|---|---|
| 5,435,646 A | 7/1995 | McArthur | |
| 5,444,637 A | 8/1995 | Smesny et al. | |
| 5,479,197 A | 12/1995 | Fujikawa et al. | |
| 5,564,889 A | 10/1996 | Araki | |
| 5,603,656 A * | 2/1997 | Baer et al. | 454/339 |
| 5,629,538 A | 5/1997 | Lipphardt et al. | |
| 5,669,713 A | 9/1997 | Schwartz et al. | |
| 5,689,878 A * | 11/1997 | Dahringer et al. | 29/841 |
| 5,790,151 A | 8/1998 | Mills | |
| 5,792,984 A * | 8/1998 | Bloom | 174/564 |
| 5,895,859 A | 4/1999 | Sawada et al. | |
| 5,969,639 A | 10/1999 | Lauf et al. | |
| 5,970,313 A | 10/1999 | Rowland et al. | |
| 6,010,538 A | 1/2000 | Sun et al. | |
| 6,033,922 A | 3/2000 | Rowland et al. | |
| 6,075,909 A | 6/2000 | Ressl | |
| 6,100,506 A | 8/2000 | Colelli, Jr. et al. | |
| 6,104,620 A * | 8/2000 | Dudas et al. | 361/800 |
| 6,164,132 A | 12/2000 | Matulek | |
| 6,181,727 B1 | 1/2001 | Stowell et al. | |
| 6,190,040 B1 | 2/2001 | Renken et al. | |
| 6,201,467 B1 | 3/2001 | Winterer et al. | |
| 6,273,544 B1 | 8/2001 | Silverbrook | |
| 6,301,097 B1 * | 10/2001 | Ellsworth et al. | 361/728 |
| 6,313,903 B1 | 11/2001 | Ogata | |
| 6,325,536 B1 | 12/2001 | Renken et al. | |
| 6,326,543 B1 * | 12/2001 | Lamp et al. | 174/546 |
| 6,378,378 B1 | 4/2002 | Fisher | |
| 6,472,240 B2 | 10/2002 | Akram et al. | |
| 6,477,447 B1 | 11/2002 | Lin | |
| 6,542,835 B2 | 4/2003 | Mundt | |
| 6,553,277 B1 | 4/2003 | Yagisawa et al. | |
| 6,590,777 B2 | 7/2003 | Morino et al. | |
| 6,607,135 B1 * | 8/2003 | Hirai et al. | 235/487 |
| 6,651,488 B2 | 11/2003 | Larson, III et al. | |
| 6,655,835 B2 | 12/2003 | Mattoon et al. | |
| 6,665,190 B2 * | 12/2003 | Clayton et al. | 361/736 |
| 6,671,660 B2 | 12/2003 | Freed | |
| 6,677,166 B2 | 1/2004 | Hunter | |
| 6,691,068 B1 | 2/2004 | Freed | |
| 6,734,027 B2 | 5/2004 | Jonkers | |
| 6,738,722 B2 | 5/2004 | Polla et al. | |
| 6,741,945 B2 | 5/2004 | Polla et al. | |
| 6,759,253 B2 | 7/2004 | Usui et al. | |
| 6,789,034 B2 | 9/2004 | Freed | |
| 6,819,559 B1 * | 11/2004 | Seeger et al. | 361/679.46 |
| 6,889,568 B2 | 5/2005 | Renken | |
| 6,915,589 B2 | 7/2005 | Sun et al. | |
| 6,930,879 B2 * | 8/2005 | Frisch et al. | 361/679.46 |
| 6,966,235 B1 | 11/2005 | Paton | |
| 6,971,036 B2 | 11/2005 | Freed | |
| 6,995,691 B2 | 2/2006 | Parsons | |
| 7,005,644 B2 | 2/2006 | Ishikawa et al. | |
| 7,135,852 B2 | 11/2006 | Renken et al. | |
| 7,360,463 B2 | 4/2008 | Renken | |
| 7,385,199 B2 | 6/2008 | DeWames et al. | |
| 7,683,270 B2 * | 3/2010 | Fernandez et al. | 174/547 |
| 7,799,614 B2 * | 9/2010 | Otremba et al. | 438/125 |
| 2001/0002119 A1 | 5/2001 | Winterer et al. | |
| 2001/0012639 A1 | 8/2001 | Akram et al. | |
| 2004/0031340 A1 | 2/2004 | Renken | |
| 2004/0074323 A1 | 4/2004 | Renken | |
| 2006/0174720 A1 | 8/2006 | Renken | |
| 2008/0192800 A1 | 8/2008 | Asada | |

FOREIGN PATENT DOCUMENTS

| | | |
|---|---|---|
| EP | 0764977 | 3/1997 |
| EP | 0865922 | 9/1998 |
| EP | 1014437 A2 | 6/2000 |
| GB | 2086807 A1 | 5/1982 |
| JP | 2000355756 A | 12/2000 |
| JP | 2002270765 A | 9/2002 |
| JP | 2005156314 A | 6/2005 |
| JP | 2005516400 A | 6/2005 |
| WO | WO00/68986 | 11/2000 |
| WO | WO02/17030 A2 | 2/2002 |
| WO | WO02/17030 A3 | 2/2002 |
| WO | 03063245 A | 7/2003 |
| WO | WO03/067183 | 8/2003 |

OTHER PUBLICATIONS

Final Office Action dated Mar. 29, 2007 for U.S. Appl. No. 10/685,550.
Notice of Allowance dated Dec. 17, 2007 for U.S. Appl. No. 10/685,550.
Notice of Allowance dated Sep. 7, 2004 for U.S. Appl. No. 10/056,906.
Office Action dated Aug. 22, 2007 of U.S. Appl. No. 10/685,550.
Office Action dated Jun. 18, 2003 for U.S. Appl. No. 10/056,906.
Final Office Action Dated Jan. 12, 2004 for U.S. Appl. No. 10/056,906.
Office Action dated Jun. 29, 2004 for U.S. Appl. No. 10/685,550.
Final Office Action dated Mar. 16, 2006 for U.S. Appl. No. 10/685,550.
Notice of Allowance and Fee(s) due dated Dec. 14, 2009 issued for U.S. Appl. No. 11/302,763.
U.S. Appl. No. 12/106,992 filed on Apr. 21, 2008.
Office Action dated Jun. 25, 2008 issued for U.S. Appl. No. 11/302,763.
Final Office Action dated Jan. 14, 2009 issued for U.S. Appl. No. 11/302,763.
Office Action dated Jun. 4, 2009 issued for U.S. Appl. No. 11/302,763.
U.S. Appl. No. 61/274,116, filed Dec. 18, 2009.
Baker et al.; "A Novel In Situ Monitoring Technique for Reactive Ion Etching Using a Surface Micromachined Sensor," IEEE Transactions on Semiconductor Manufacturing, vol. 11, No. 2, May 1998, pp. 254-264.
Prov. U.S. Appl. No. 60/285,613, filed Apr. 19, 2001; Freed et al.; "Firmware, Methods, Apparatus, and Computer Program Products for Wafer Sensors".
Prov. U.S. Appl. No. 60/285,439, filed Apr. 19, 2001; Freed et al.; "Methods Apparatus, and Computer Program Products for Obtaining Data for Process Operation, Optimization, Monitoring, and Control".
Freed et al.; "Autonomous On-Wafer Sensors for Process Modeling, Diagnosis, and Control," IEEE Transactions on Semiconductor Manufacturing, vol. 14, No. 3, Aug. 2001, pp. 255-264.
Freed; "Wafer-Mounted Sensor Arrays for Plasma Etch Processes", Dissertation, Univ. of CA. Berkeley, Fall 2001.
International Search Report, corresponding to PCT/US03/00751, Aug. 1, 2003, 3 pages.
"Notification of Transmittal of the International Search Report or the Declaration", corresponding PCT application No. PCT/US03/00751, International Searching Authority, European Patent Office, Jun. 8, 2003, 7 pages.
PTO, "Office Action," corresponding U.S. Appl. No. 10/685,550, Sep. 25, 2006, 18 pages.
Rubitherm GmbH, "Rubitherm® RT, Phase Change Material based on n-Paraffins and Waxes," Innovative PCM's and Thermal Technology, Rubitherm Phase Change Material, Version: Jun. 15, 2004, 2 pages.
Unsolicited e-mail from Steve Maxwell at steve_maxwell60@yahoo.com to info@phdr-law.com, dated Jan. 3, 2006, 1 page.
JPO First Office action issued date Feb. 15, 2011 for Japanese Patent Application No. 2006-357220.
Taiwan Office action and Taiwan IPO Search Report mailed date Oct. 15, 2012 issued for Taiwan Invention Patent Application No. 095146033.
Korean Office Action mailed date May 14, 2013, issued for Korean Patent Application No. 2006-0127027.

* cited by examiner

COMPONENT PACKAGE FOR MAINTAINING SAFE OPERATING TEMPERATURE OF COMPONENTS

CLAIM OF PRIORITY

This application is a continuation-in-part of and claims the priority benefit of U.S. patent application Ser. No. 11/302,763, filed Dec. 13, 2005 and published as U.S. Patent Application Publication Number 20060174720, the entire contents of which are incorporated herein by reference. This application also claims the priority benefit of U.S. patent application Ser. No. 12/642,695, filed Dec. 18, 2009 as U.S. patent application Ser. No. 12/642,695 and converted to a provisional application as U.S. Patent Application 61/274,116 on Jan. 7, 2010, the entire contents of which are incorporated herein by reference.

FIELD OF THE INVENTION

This invention generally relates to high temperature, wireless measurement devices and more particularly to methods that keep the components of the devices safe while the device is exposed to high temperatures over an extend period of time.

BACKGROUND OF THE INVENTION

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum pressure, chemical gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and thus the performance of the integrated circuit. Using a substrate-like device to measure the processing conditions that is of the same or similar material as the integrated circuit or other device provides the most accurate measure of the conditions because the thermal conductivity of the substrate is the same as the actual circuits that will be processed. Gradients and variations exist throughout the chamber for virtually all process conditions. These gradients therefore also exist across the surface of a substrate. In order to precisely control processing conditions at the substrate, it is critical that measurements be taken upon the substrate and that the readings are available to an automated control system or operator so that the optimization of the chamber processing conditions can be readily achieved. Processing conditions include any parameter used to control semiconductor or other device manufacture or any condition a manufacturer would desire to monitor.

U.S. Pat. No. 6,691,068 to Freed et al. teaches a sensor apparatus capable of measuring data, processing data, storing data, and transmitting data for a process tool used for processing workpieces. The sensor apparatus includes an information processor, embedded executable commands for controlling the apparatus, and at least one sensor. The sensor apparatus is capable of being loaded into a process tool. The sensor apparatus has capabilities for near real time data collection and communication.

Conventionally, the low profile wireless measurement device is mounted on the substrate to measure the processing conditions. For a low profile wireless measurement device to work in a high temperature environment (e.g., temperatures greater than about 150° C.), certain key components of the device, such as thin batteries and microprocessors, must be able to function when the device is exposed to the high temperature environment. Conventionally, the back AR coating (BARC) process operates at 250° C.; a CVD process may operate at a temperature of about 500° C.; and a PVD process may operate at about 300° C. Unfortunately, many types of battery, for example thin film Li batteries, melt at 180° C. The battery packaging materials may outgas at 180° C. also causing battery damage.

To build a high temperature (150° C. and higher) version of a wireless temperature measurement device, certain components that are commercially available have limited ability to operate at high temperatures. Furthermore, components with sufficient high temperature capability are not likely to be commercially available in the near future. A further challenge is that, in addition to being insulated against heat transfer, the battery should keep a profile of 2 mm or less in the wireless measurement device in order to fit into various process chambers.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

U.S. Pat. No. 6,889,568 and US publication No. 20060174720 to Renken et al. (the entire disclosures of both of which are incorporated herein by reference) teach a measuring device incorporating a substrate with a plurality of sensors attached to the substrate used to measure the processing conditions of the substrate during the manufacturing. The substrate can be inserted into a processing chamber by a robot head and the measuring device can transmit the conditions in real time or store the conditions for subsequent analysis. Sensitive electronic components of the device can be distanced or isolated from the most deleterious processing conditions in order to increase the accuracy, operating range, and reliability of the device. Often however, it may not be practical or desirable to raise an electronic component on legs if a low profile is desired. In addition, raising the component above a substrate might not be sufficient by itself to protect the components exposed to high temperatures over an extended period of time.

Figure 1A:
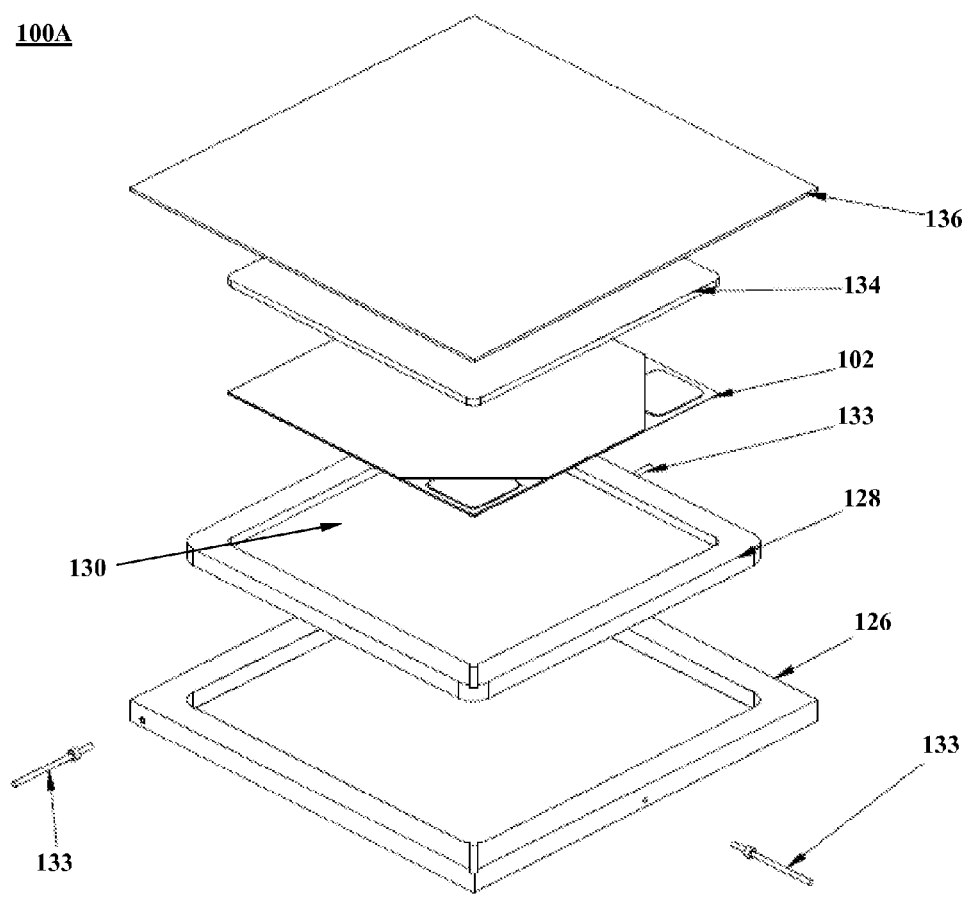
FIG. 1A is an exploded three dimensional diagram of a thin insulated component package according to an embodiment of the present invention.
Figure 1B:
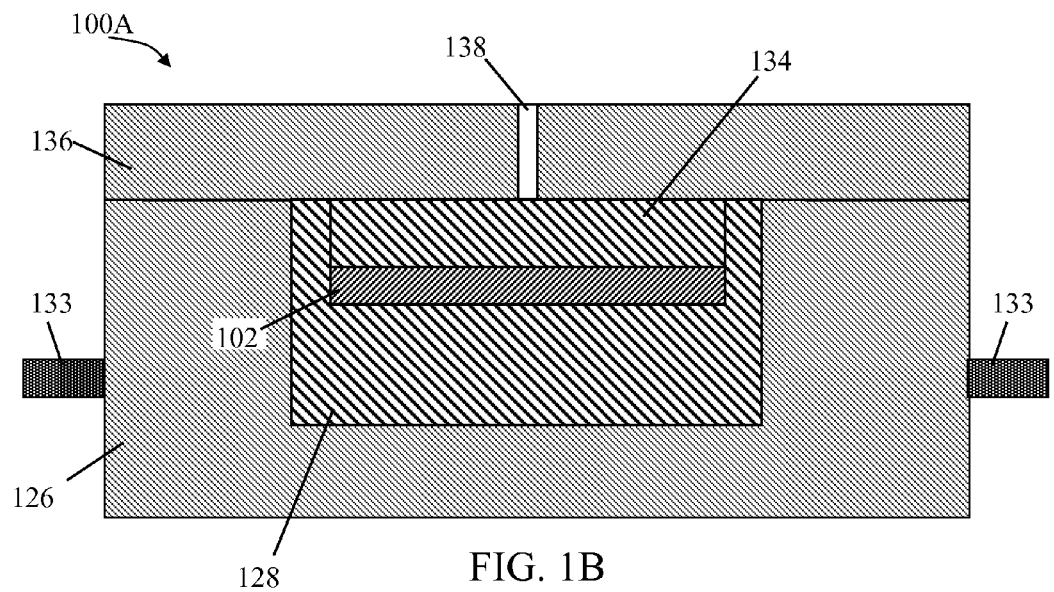
FIG. 1B is a cross-sectional view of a thin insulated component package according to an embodiment of the present invention.

Embodiments of the present invention utilize novel thin insulated component packages that keep temperature-sensitive components within a safe operating temperature range while the device is exposed to high temperatures over an extended period of time (such as survey time). FIG. 1A is an exploded three dimensional diagram and FIG. 1B is a schematic cross-sectional view of a thin insulated component package 100A according to an embodiment of the present invention. The package 100A can include a thermally insulating outer enclosure 126 which may be made of a thermally insulating material, such as a ceramic glass. It is desirable to make the outer enclosure 126 from high specific heat capacity materials to add thermal mass to the package 100A without adding too much height.

As used herein, the term "thermally insulating" refers to the property of being resistant to transfer of heat across a material or medium as a result of low thermal conductivity and/or high heat capacity. As used herein, the term "thermally absorbing" refers to the property of being resistant to transfer of heat as a result of high heat capacity, but not necessarily due to low thermal conductivity. As may be seen from the foregoing, "thermally absorbing" is a subset of "thermally insulating."

The thermally insulating outer enclosure 126 can be made of a thin, flat and high modulus material, e.g., sapphire, mica, an Inconel alloy, Kovar, ceramic, or a combination of Kovar and ceramic. Inconel is a registered trademark of Special Metals Corporation that refers to a family of austenitic nickel-chromium-based superalloys. A non-limiting example of an Inconel alloy is Inconel 600, which is 72% nickel, 14-17% chromium, 6-10% iron, 1% manganese, 0.5% copper, 0.5% silicon, 0.15% carbon and 0.015% sulfur. Kovar is a trademark of Carpenter Technology Corporation and refers to a nickel-cobalt ferrous alloy designed to be compatible with the thermal expansion characteristics of borosilicate glass. The composition of Kovar is about 29% nickel, 17% cobalt, less than 0.1% carbon, 0.2% silicon, 0.3% manganese with the balance being iron.

An insulating insert 128 is sized and shaped to fit within a cavity or recess in the outer enclosure 126. The insert 128 can be made essentially of high temperature machinable thermally insulating refractory ceramic material. Examples of such materials include, but are not limited to, commercially available rigid ceramic materials made from silica ($SiO_2$) or yttria-stabilized ceramic fibers, e.g., Zirconia ($ZrO_2$) fibers, that do not undergo the usual phase transitions associated with pure form of the ceramic. Other suitable materials include mica ceramic. By way of example, and not by way of limitation, a suitable ceramic material may have a nominal composition of about 90% by weight of Zirconia ($ZrO_2$) and Hafnia ($HfO_2$) (e.g., about 1-2 wt % Hafnia, which occurs naturally with Zirconia) and about 10% by weight of yttria ($Y_2O_3$). It is possible that other oxides may be present as impurities, e.g., of 0.1% or less.

The insulating insert 128 can encapsulate a thin electronic component 102, e.g., a thin film battery. By way of example, and not by way of limitation, the thickness of the component 102 may be about 6 mils. By way of example, the insert 128 may include an inner cavity or recess 130 that is sized and shaped to receive the component 102. By way of example, and not by way of limitation, the electronic component 102 may be, e.g., a thin film battery or an integrated circuit, such as a processor. The inner cavity 130 is generally thinner than the cavity in the enclosure 126. By way of example, and not by way of limitation, the inner cavity 130 may be ⅔ the overall thickness of the component package 100A. By way of example, the overall dimensions of the enclosure 126 and insert 128 the may be selected such that the component package 100A is approximately 36 mm square by 5 to 6 mm thick or less.

One or more feed-thrus for kinematic anchors 133 or electrical connections to the electronic component 102 may be formed in the outer enclosure 126 or the insert 128. The kinematic anchors 133 can facilitate mounting the component package 100A to a substrate, such as a semiconductor wafer. By way of example, and not by way of limitation, the kinematic anchors may be pins that fit into holes or recesses in a side of the outer enclosure 126. The pins can mount the outer enclosure to a kinematic structure that mounts the component package 100A onto a substrate. The kinematic structure can be custom made to the package size. Each pin may include a shoulder proximate one end to stop the pin from sliding too far into the hole in the side of the enclosure. The pins may be made of a suitable material having good structural properties and relatively good thermally insulating properties, such as stainless steel. Each pin can be received at a second end by a corresponding structure (e.g., a slot or groove) on the substrate. The use of sufficiently small diameter straight pins in holes in a side of the outer enclosure can provide for stability in mounting the component package 100A to the substrate while reducing thermal contact with the substrate.

The electronic component 102 may be bonded into the inner cavity 130 of the insert 128, e.g., using a suitable adhesive (e.g., Fire Temp glue) or other bonding technique. An optional insulating cover piece 134 may be sized and shaped to cover the electronic component 102 and close the inner cavity 130. The cover piece 134 may be made of the same insulating ceramic material as the insert 128. The package 100A may be sealed with a lid 136 that is bonded to a top of a wall of the insert 128, or a top of a wall of the outer enclosure 126, e.g., with a high temperature adhesive. By way of example, the lid 136 may be made of a material having similar thermal expansion characteristics to that of the outer enclosure 126. By way of example and not by way of limitation, if the outer enclosure 126 is made of a ceramic glass such as borosilicate glass or $Al_2O_3$ ceramic, the lid 136 may be made of Kovar. Alternatively, the lid 136 can be bonded to a top of a wall of the insert 128 or to a substrate to which the package 100A is to be mounted. In such cases, the lid 136 may be made of a material having similar thermal expansion characteristics to that of the insert or the substrate. For example, if the lid is to be bonded to a substrate that is made of silicon, the lid 136 can also be made of silicon.

The electronic component 102 and insert 128 can be sealed in the outer enclosure 126 under vacuum so that vacuum further insulates the electronic component 102. By way of example, and not by way of limitation, the thickness of the wall of the outer enclosure 126 may be about 10 to 15 mil. The internal volume of the enclosure cavity may be about 1 cubic centimeter (1 ml). The enclosure 126 may be internally and externally coated with low emissivity film, e.g., gold film, or a film having emissivity similar to that of gold or lower than that of gold, to minimize radiative heat transfer from the enclosure to the parts inside. The enclosure 126 can have a through hole 138, to evacuate the space inside the enclosure to minimize heat transfer by conduction and convection when the enclosure 126 is inside a vacuum chamber in a process tool. Furthermore, the materials of the outer enclosure 126 may be high specific heat materials selected to add thermal mass to the package without adding too much height. Examples of suitable materials include, but are not limited to, for example, sapphire, stainless steel, Kovar, an Inconel alloy or a ceramic material or combinations of two or more of these materials or materials having similar specific heat capacities to these materials or higher specific heat capacities.

Furthermore, the outer enclosure 126 is preferably made of strong material that can hold its shape under vacuum.

Figure 1C:
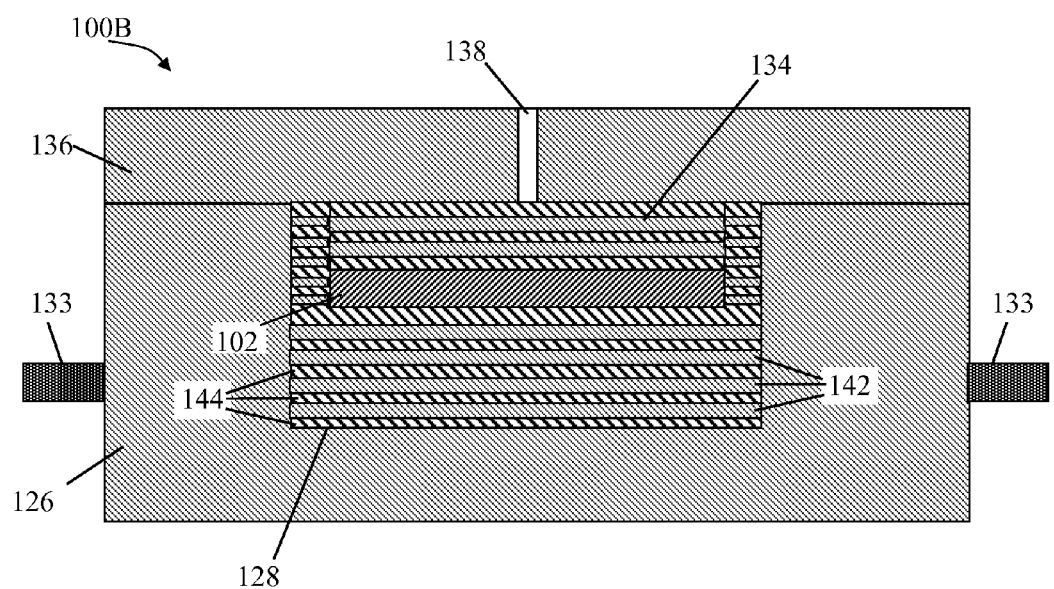
FIG. 1C is a cross-sectional view of a thin insulated thin component package according to an alternative embodiment of the present invention.

In another embodiment of the present invention, the construction of the insert 128 and cover piece 134 in the component package 100A may altered to slow down the increase in temperature of the electronic component 102. As shown in FIG. 1C, a thin insulated component package 100B may be configured similarly to the component package 100A of FIGS. 1A-1B. Specifically, the package 100B can include a thermally insulating outer enclosure 126, an insert 128 made is sized and shaped to fit within a cavity in the outer enclosure 126. The insert includes an inner cavity sized and shaped to receive a thin electronic component 102. In this embodiment, the insert can be made of alternating interdigitated layers of thermally absorbing material 142 and low thermal conductivity material or medium 144. A cover piece 134 for the insert can be similarly constructed. By way of example, the thermally absorbing material 142 may include Inconel, or Kovar and the low thermal conductivity material or medium 144 can include a ceramic material, e.g., a high temperature machinable thermally insulating refractory ceramic material, such as that described above or vacuum. Alternating thermally absorbing material and low thermal conductivity material or medium in the insert 128 can reduce the rate of temperature change of the electronic component 102.

Figure 2A:
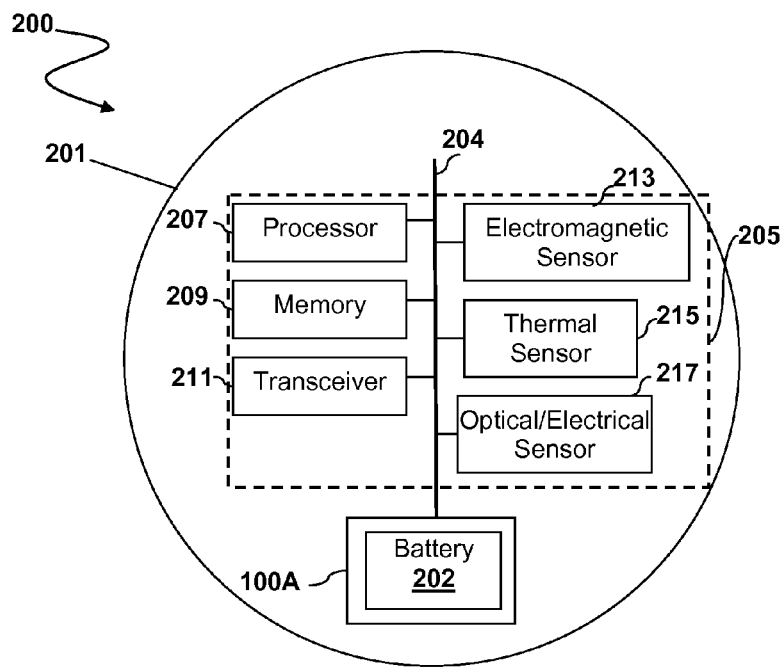
FIG. 2A is a top view schematic diagram of a measurement substrate with thin insulated component packages mounted on top of the substrate.

One or more thermally insulated electronic component packages like that shown in FIGS. 1A-1C may be mounted on a substrate, such as a semiconductor wafer, with or without stand-offs to further insulate the package from the substrate. For example, as shown schematically in FIG. 2A, a process condition measurement device 200 may have one or more thin insulated component packages 100A of the type depicted in FIG. 1A mounted on a top surface of a substrate 201. The substrate may be the same size and shape as a standard substrate processed by a semiconductor wafer processing system. Examples of standard sized substrates include, but are not limited to 150 mm, 200 mm and 300 mm semiconductor wafers. By way of example, and not by way of limitation, an electronic component such as a battery 202 can be mounted within one of the packages 100A. The battery 202 may be electrically connected to a bus 204. There may alternatively be only one battery package or more than two batteries installed, depending upon the application and resulting power needs. The device 200 may include measurement electronics 205 that are powered by the batteries and/or exchange electronic signals through the bus 204. By way of example, and not by way of limitation, the measurement electronics 205 may include a processor module 207, a memory 209, a transceiver 211, and one or more process condition sensors, e.g., an electromagnetic sensor 213, a thermal sensor 215, and an optical or electrical sensor 217. In some embodiments, certain elements of the measurement electronics 205 (e.g., the processor module 207, memory 209, transceiver 211, thermal sensor 215, or optical sensor 217) may be packed in component packages of the types described herein.

The processor module 207 may be configured to execute instructions stored in the main memory 209 in order for the device 200 to properly measure process parameters when the device is placed within a substrate processing tool. The main memory 209 may be in the form of an integrated circuit, e.g., RAM, DRAM, ROM and the like. The transceiver 211 may be configured to communicate data and/or electrical power two or from the device 200.

Figure 2B:
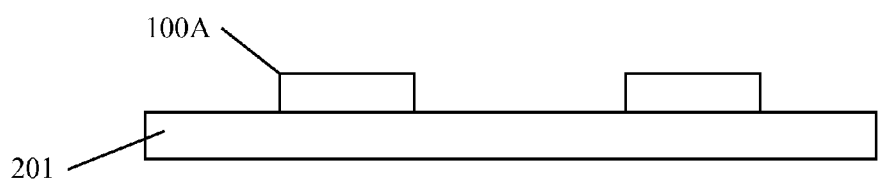
FIG. 2B is a side view of the measurement substrate of FIG. 2A with thin insulated component packages mounted on top of the substrate without stand-offs according to an embodiment of the present invention.
Figure 2C:
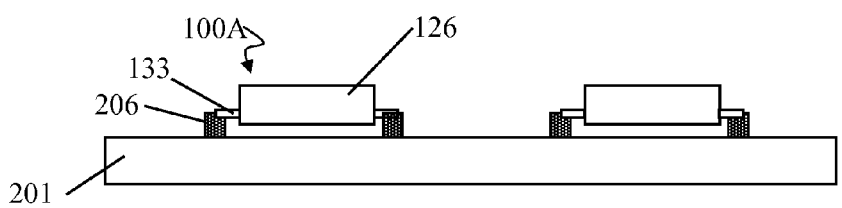
FIG. 2C is a side view of the measurement substrate of FIG. 2A with thin insulated component packages mounted on top of the substrate with stand-offs according to an embodiment of the present invention.
Figure 2D:
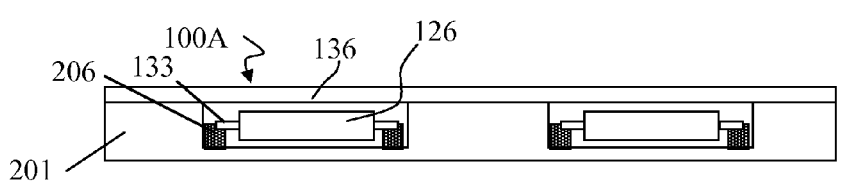
FIG. 2D is a side view cross-section of the measurement substrate of FIG. 2A with thin insulated component packages mounted into substrate cavities according to an embodiment of the present invention.

As seen in FIG. 2B, two or more component packages 100A may be mounted directly on the top surface of the substrate 201. Alternatively, as shown in FIG. 2C, two or more component packages 100A may be mounted to the top surface of the substrate 201 using a kinematic structure 206 that mounts the outer enclosure via the kinematic mounts 133. This allows for a gap between the component packages 100A and the substrate 201 to further insulate the batteries from the substrate. The kinematic structure 206 may include slots or grooves to receive the kinematic mounts 133 e.g., pins as described above. Furthermore, as shown in FIG. 2D, two or more component packages 100A may be mounted into substrate cavities formed in the top surface of the substrate 201 to provide a low profile. The component packages 100A may be mounted via the kinematic mounts 133 to a kinematic structure 206 in the outer cavity.

As noted above, the use of sufficiently small diameter pins in holes in a side of the outer enclosure can provide for stability in mounting the component package 100A to the substrate 201 while reducing thermal contact with the substrate. As also noted above, the lid 136 can be mounted to the substrate 201 and cover the substrate 201 and the cavities into which the outer enclosures 126 are mounted. Alternatively, each cavity may have an individual lid. Furthermore, each component package 100A may alternatively be mounted into a cavity without a lid.

By appropriate selection of the thickness of the component 102, the outer enclosure 126, insert 128, and cover piece 134, the profile of the measurement device 200 may be made less than 2 mm above the surface of the substrate 201. Such a device can be used to do in-situ measurements of process conditions in a semiconductor process tool without mechanically interfering with the operation of the tool.

Many variations on the above-described embodiments are within the scope of embodiments of the present invention. For example, the thickness of the lower wall or sidewalls of the insert 128 can be varied depending on whether a source of heat is located above, below, or to a side of the component package. Similarly, the thickness of the cover piece 134 may vary, or the cover piece may be omitted entirely, depending on whether the heat source is located above or below the component package.

Although the present invention has been described in considerable detail with reference to certain preferred versions thereof, other versions are possible. For example, although a pump-down hole is shown in FIGS. 1B-1C, embodiments of the invention include constructions in which the pump-down hole is omitted. Therefore, the spirit and scope of the appended claims should not be limited to the description of the preferred versions contained herein. Instead, the scope of the invention should be determined with reference to the appended claims, along with their full scope of equivalents. All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶ 6. In particular, the use of "step of" in the claims herein is not intended to invoke the provisions of 35 USC §112, ¶ 6.

The reader's attention is directed to all papers and documents which are filed concurrently with this specification and which are open to public inspection with this specification, and the contents of all such papers and documents incorporated herein by reference.

What is claimed is:

1. A thermally insulated electronic component package, comprising:
    a thin electronic component;
    a thermally insulating outer enclosure;
    an insert made of a thermally insulating material that is sized and shaped to fit within the outer enclosure, wherein the insert includes an inner cavity sized and shaped to receive the thin electronic component, and wherein the insert is made of alternating interdigitating layers of low thermal conductivity material and thermally absorbing material; and
    one or more structures configured to mount the outer enclosure to a substrate.

2. The thermally insulated electronic component package of claim 1 wherein the thin electronic component comprises a battery.

3. The thermally insulated electronic component package of claim 1, wherein the thermally insulating outer enclosure is made of one or more high heat capacity materials.

4. The thermally insulated electronic component package of claim 3, wherein the high heat capacity materials include stainless steel, an austenitic nickel-chromium-based superalloy, a nickel-cobalt ferrous alloy or a ceramic material.

5. The thermally insulated electronic component package of claim 1 where in the outer enclosure is made of a low thermal conductivity material.

6. The thermally insulated electronic component package of claim 1 wherein the outer enclosure is made of a low emissivity and high heat capacity material.

7. The thermally insulated electronic component package of claim 1 wherein the enclosure is made of stainless steel, an austenitic nickel-chromium-based superalloy, a nickel-cobalt ferrous alloy, or a ceramic material.

8. The thermally insulated electronic component package of claim 7 wherein the thickness of a wall of the enclosure is about 10 to 15 mil.

9. The thermally insulated electronic component package of claim 1 wherein an inner and outer surface of the outer enclosure is coated with a thin film containing a low emissivity material.

10. The thermally insulated electronic component package of claim 9 wherein the low emissivity material is gold.

11. The thermally insulated electronic component package of claim 1 wherein one or more of the structures include one or more pins configured to fit into one or more corresponding holes in a side of the outer enclosure.

12. The thermally insulated electronic component package of claim 1 wherein a total thickness of the enclosure about 5 to 6 mm or less.

13. The thermally insulated electronic component package of claim 1 wherein the enclosure is evacuated and sealed.

14. The thermally insulated electronic component package of claim 1, further comprising a cover piece sized and shaped to cover the electronic component and close the inner cavity.

15. The thermally insulated electronic component package of claim 14 wherein the cover piece is made of the same material as the insert.

16. The thermally insulated electronic component package of claim 1, further comprising a lid that is bonded to a top of a wall of the outer enclosure or to a substrate to which the thermally insulated electronic component package is mounted.

17. The thermally insulated electronic component package of claim 16 wherein the lid is made of a material having similar thermal expansion characteristics to that of the enclosure.

18. The thermally insulated electronic component package of claim 1 wherein the insert is made of a thermally insulating ceramic material.

19. The thermally insulated electronic component package of claim 18 wherein the ceramic material is a machinable ceramic material.

20. An electronic instrument suitable for process conditions in a high temperature environment, comprising:
    a substrate;
    one or more thermally insulated electronic component package having a thermally insulating outer enclosure configured to mount to the substrate;
    a plurality of stand-offs configured to provide support between the outer enclosure and the substrate, wherein a gap is present between a bottom surface of the enclosure and the substrate;
    an insert made of a thermally insulating material that is sized an shaped to fit within the outer enclosure, wherein the insert includes an inner cavity sized and shaped to receive a thin electronic component; and
    a thin electronic component disposed within the inner cavity.

21. The instrument of claim 20 wherein the outer enclosure is mounted on a top surface of the substrate.

22. The instrument of claim 20 wherein the substrate includes a substrate cavity and the outer enclosure is mounted in the substrate cavity.

23. The instrument of claim 22 further comprising a lid configured to cover the substrate and the electronic component.

24. The instrument of claim 23 wherein the lid piece is made of the same material as the substrate.

25. The instrument of claim 20, further comprising a lid that is bonded to a top of the insert or to a top of a wall of the outer enclosure or to the substrate.

26. The instrument of claim 25 wherein the lid is made of a material having similar thermal expansion characteristics to that of the outer enclosure or the substrate.

27. The instrument of claim 21, further comprising one or more structures configured to mount the outer enclosure to a substrate.

28. The instrument of claim 27 wherein one or more of the structures include one or more pins, each pin having a first end configured to fit into one or more corresponding holes in a side of the outer enclosure and one or more structures on the substrate, wherein each of the one or more structures is configured to receive a second end of a corresponding one of the pins.

\* \* \* \* \*